(12) United States Patent
Gilson et al.

(10) Patent No.: US 10,989,763 B2
(45) Date of Patent: Apr. 27, 2021

(54) SYSTEM AND METHOD FOR LOCATING EVENTS AND/OR DEVICES ON A NETWORK

(71) Applicant: Comcast Cable Communications, LLC, Philadelphia, PA (US)

(72) Inventors: Ross Gilson, Philadelphia, PA (US); William Carroll VerSteeg, Buford, GA (US); Lawrence Wolcott, Denver, CO (US)

(73) Assignee: Comcast Cable Communications, LLC, Philadelphia, PA (US)

( * ) Notice: Subject to any disclaimer, the term of this patent is extended or adjusted under 35 U.S.C. 154(b) by 585 days.

(21) Appl. No.: 15/720,043

(22) Filed: Sep. 29, 2017

(65) Prior Publication Data

US 2018/0095121 A1 Apr. 5, 2018

Related U.S. Application Data

(60) Provisional application No. 62/402,642, filed on Sep. 30, 2016.

(51) Int. Cl.
| | |
|---|---|
| *G01R 31/50* | (2020.01) |
| *G01R 31/08* | (2020.01) |
| *H04L 12/24* | (2006.01) |
| *H04L 12/06* | (2006.01) |
| *H04L 1/00* | (2006.01) |
| *H04L 1/06* | (2006.01) |
| *H04L 1/20* | (2006.01) |
| *H04L 12/26* | (2006.01) |

(52) U.S. Cl.
CPC .......... *G01R 31/50* (2020.01); *G01R 31/086* (2013.01); *H04L 1/00* (2013.01); *H04L 1/0675* (2013.01); *H04L 1/206* (2013.01); *H04L 41/12* (2013.01); *H04L 43/0817* (2013.01)

(58) Field of Classification Search
CPC ......... G01R 31/50; G01R 31/086; H04L 1/00; H04L 41/12; H04L 43/0817; H04L 1/206; H04L 1/0675
USPC ...................................................... 455/456.1
See application file for complete search history.

(56) References Cited

U.S. PATENT DOCUMENTS

| | | | | |
|---|---|---|---|---|
| 9,441,979 | B2* | 9/2016 | Barnard | H04W 4/024 |
| 2005/0105697 | A1* | 5/2005 | Hollowell | H04M 1/658 |
| | | | | 379/88.13 |
| 2005/0186938 | A1* | 8/2005 | Hunter | G01S 5/04 |
| | | | | 455/404.2 |
| 2013/0016636 | A1* | 1/2013 | Berger | H04W 60/00 |
| | | | | 370/310 |
| 2014/0348185 | A1* | 11/2014 | Ling | H04L 12/4625 |
| | | | | 370/503 |
| 2016/0105359 | A1* | 4/2016 | Kim | H04L 45/14 |
| | | | | 370/252 |
| 2016/0156388 | A1* | 6/2016 | Zeine | H02J 50/80 |
| | | | | 307/104 |
| 2017/0082726 | A1* | 3/2017 | Gassion | G01S 1/08 |
| 2018/0152983 | A1* | 5/2018 | Marquardt | H04W 76/10 |

* cited by examiner

*Primary Examiner* — Inder P Mehra
(74) *Attorney, Agent, or Firm* — BakerHostetler

(57) ABSTRACT

System and methods for locating events and/or devices on a network are described.

18 Claims, 9 Drawing Sheets

SYSTEM AND METHOD FOR LOCATING EVENTS AND/OR DEVICES ON A NETWORK

CROSS-REFERENCE TO RELATED APPLICATIONS

This application claims priority to U.S. Provisional Patent Application No. 62/402,642, filed Sep. 30, 2016, the contents of which is incorporated herein by reference in its entirety.

BACKGROUND

Locating a position of a device (e.g., package, user device, network device) or an event (e.g., infrastructure signal leak) may facilitate improved service over the network.

Current geolocation solutions may require a global positioning device (GPS) on an end device. However, current GPS devices are unreliable when there is not a clear line of sight for satellite communication such as with indoor environments. Furthermore, once the GPS location is determined, the transmission of the GPS information over a network may impact the useable bandwidth for other information.

Improvements in location and network services are needed.

SUMMARY

Systems and methods for locating events and/or devices on a network are described. Certain recipient device on a network may receive information such as a beacon or packet and may report on the receipt of such information. As such, accuracy of such locating (e.g., geolocation) may be dependent on the accuracy of the positioning of such recipient devices, the multipath environment, and the accuracy of the timestamp marking reception time. The present disclosure describes systems and methods for enhancing the accuracy of the device positioning. Additionally, or alternatively, similar mechanism may be employed to more accurately determine a position of a leakage point in a network.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
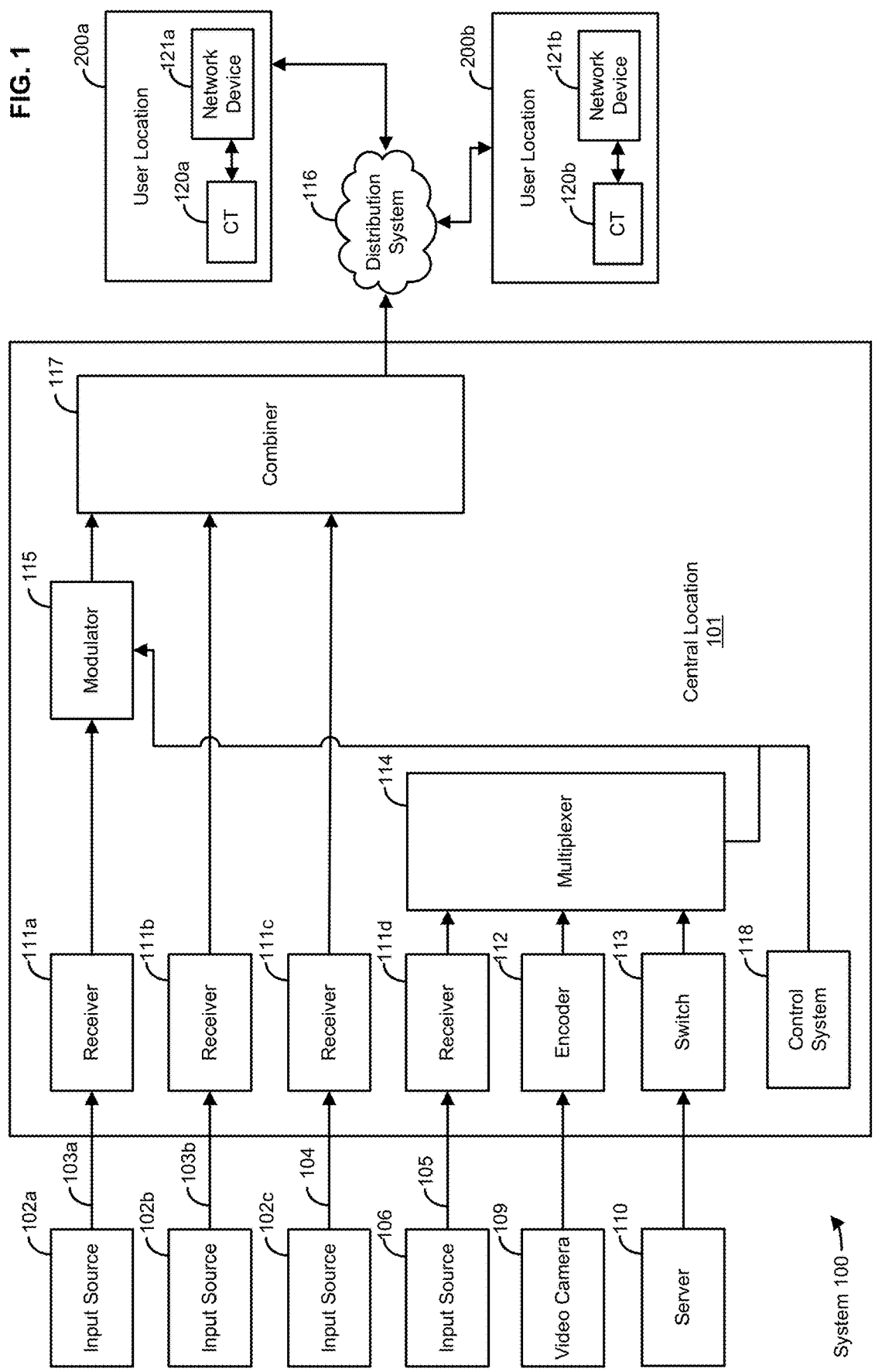
FIG. 1 is a block diagram of an example system.

Geolocation systems and methods may include one or more devices configured to transmit and/or receive a beacon (e.g., locator information, packet, data bundle, etc.). The beacon may be a transmitted beacon or a responsive communication to a received beacon. Network devices, such as gateways, may receive the beacon and may determine a time of arrival of the beacon. The time of arrival of the beacon at one or more network devices may be transmitted to a controller such as a radio controller. The controller may determine the location of the various network devices and may transmit the locations and the respective time of arrival to a geolocation resolver. The geolocation resolver may process the received information to determine a location of the devices. For example, the geolocation resolver may use a trilateration and/or a multilateration technique to determine the location of the devices.

Trilateration may comprise the use of a beacon (e.g., information packet) that includes a time code (e.g., clock measurement). As such, recipient devices of the beacon may rely on the time code to determine transit time of the beacon from transmission time to receipt time. As is understood, geometries (e.g., spheres) may be applied to each recipient device to result in overlap of the applied geometries. Such overlap or intersection may be used to determine a location of a source of the beacon or beacon ingress/egress into a network. The term trilateration may refer to the use of information at multiple recipient devices including two, three, or more.

Multilateration may comprise the use of a beacon (e.g., information packet) that does not include a time code (e.g., clock measurement). As such, recipient devices of the beacon may not be able to rely on a transmission time to determine transit time of the beacon. Alternatively, various recipient devices (e.g., gateways) may share a common clock with each other. In certain aspects, the source of the beacon may not share a common clock with recipient devices. However, any two recipient devices may determine a time delta of arrival of the beacon with respect to another recipient device. As such, a paraboloid may be applied to the recipient devices and may include the source of the beacon. The intersection of two paraboloids is a curve. The intersection of three paraboloids is two points. The intersection of four paraboloids is a point (e.g., with an error determination). Such overlap or intersection may be used to determine a location of a source of the beacon or beacon ingress/egress into a network.

As described, various devices may rely on a common clock. A common clock may include a timing mechanism that may be correlated between several devices. GPS receivers share a common clock with the GPS satellites, within ~30 ns. DOCSIS devices share a common clock with anybody on the same CMTS, within ~4 ns. Other common clocks may be used.

Multipath may refer to a scenario where a signal may not travel a direct path between source and recipient device. For example, when a reflective object interacts with a radio wave, some of the radio waves may reach a receiver later in time than those that would have followed a direct path. This causes errors in the perceived distance between the objects, and thus may cause errors in geolocation.

The term strata may represent a grouping of measurements. For example, "strata one" may indicate that all of the clocks in a certain set of devices are within a certain first tolerance. As another example, "strata two" may indicate that all of the clocks in a certain set of devices gateways are within a second tolerance that may be less precise than the first tolerance.

FIG. 1 illustrates various aspects of an exemplary system in which the present methods and systems may operate.

Those skilled in the art will appreciate that present methods may be used in systems that employ both digital and analog equipment. One skilled in the art will appreciate that provided herein is a functional description and that the respective functions may be performed by software, hardware, or a combination of software and hardware.

The system 100 may comprise a central location 101 (e.g., a central office or a headend), which may receive content (e.g., data, programming, and the like) from multiple sources. The central location 101 may combine the content from the various sources and may distribute the content to user (e.g., subscriber) locations (e.g., location 200a) via distribution system 116.

The central location 101 may receive content from a variety of sources 102a, 102b, 102c. The content may be transmitted from the source to the central location 101 via a variety of transmission paths, including wireless (e.g., satellite paths 103a, 103b) and terrestrial path 104. The central location 101 may also receive content from a direct feed source 106 via a direct line 105. Other input sources may comprise capture devices such as a video camera 109 or a server 110. The signals provided by the content sources may include a single content item or a multiplex that includes several content items.

The central location 101 may comprise one or a plurality of receivers 111a, 111b, 111c, 111d that are each associated with an input source. For example, MPEG encoders such as encoder 112, are included for encoding local content or a video camera 109 feed. A switch 113 may provide access to server 110, which may be a Pay-Per-View server, a data server, a network (e.g., internet) router, a network system, a phone system, and the like. Some signals may require additional processing, such as signal multiplexing, prior to being modulated. Such multiplexing may be performed by multiplexer (mux) 114.

The central location 101, in one embodiment, may comprise one or a plurality of modulators, 115a, 115b, 115c, and 115d, for interfacing to the distribution system 116. The modulators may convert the received content into a modulated output signal suitable for transmission over the distribution system 116. The output signals from the modulators may be combined, using equipment such as a combiner 117, for input into the distribution system 116.

A control system 118 may permit a system operator to control and monitor the functions and performance of system 100. The control system 118 may interface, monitor, and/or control a variety of functions, including, but not limited to, the channel lineup for the television system, billing for each user, conditional access for content distributed to users, and the like. Control system 118 may provide input to the modulators for setting operating parameters, such as system specific MPEG table packet organization or conditional access information. The control system 118 may be located at central location 101 or at a remote location.

The distribution system 116 may distribute signals from the central location 101 to user locations, such as user locations 200a, 200b. The distribution system 116 may be an optical fiber network, a coaxial cable network, a hybrid fiber-coaxial network, a wireless network, a satellite system, a direct broadcast system, or any combination thereof. There may be a multitude of user locations connected to distribution system 116. At one or more user locations 200a, 200b a communication terminal (CT) 120a, 120b, such as a network device, decoder, or user device may decode, if needed, the signals for display on a display device, such as on a handheld screen or television set (TV) or a computer monitor. Those skilled in the art will appreciate that the signal may be decoded in or for a variety of equipment, including an HCT, a computer, a TV, a monitor, or satellite dish. In an exemplary aspect, the methods and systems disclosed may be located within, or performed on, one or more CT's 120a, 120b, TV's, central locations 101, DVR's, home theater PC's, and the like.

One or more network devices 121a, 121b (e.g., gateway, router, access point, set-top box) may be disposed at one or more user locations 200a, 200b. As an example, one or more of the network devices 121a, 121b may facilitate the connection of a device, such as user device, to a network such as a local area network (LAN), wide area network (WAN), the Internet, and the like. As a further example, one or more of the network devices 121a, 121b may be configured as a wireless access point (WAP). In an aspect, one or more network devices 121a, 121b may be configured to allow one or more wireless devices to connect to a wired and/or wireless network using Wi-Fi, Bluetooth or any desired method or standard.

The network devices 121a, 121b may be configured as a local area network (LAN). As an example, one or more network devices 121a, 121b may comprise a dual band wireless access point. As an example, the network devices 121a, 121b may be configured with a first service set identifier (SSID) (e.g., associated with a user network or private network) to function as a local network for a particular user or users. As a further example, the network devices 121a, 121b may be configured with a second service set identifier (SSID) (e.g., associated with a public/community network or a hidden network) to function as a secondary network or redundant network for connected communication devices.

One or more network devices 121a, 121b may comprise an identifier. As an example, one or more identifiers may be or relate to an Internet Protocol (IP) Address IPV4/IPV6 or a media access control address (MAC address) or the like. As a further example, one or more identifiers may be a unique identifier for facilitating communications on the physical network segment. In an aspect, each of the network devices 121a, 121b may comprise a distinct identifier. As an example, the identifiers may be associated with a physical location of the network devices 121a, 121b.

One or more network devices 121a, 121b may be configured to communicate via a protocol, specification (e.g., standard), format, and the like. As an example, one or more network devices 121a, 121b may be configured to communicate via Multimedia over Coax Alliance (MoCA) or a low power network protocol such as LoRa.

As an illustrative example, a user device (e.g., gateway, CT 120, network device 121) located at a premises may receive a network service, for example, via a service signal transmitted to the premises. The service signal may be received by the user device via a drop line. Alternatively or additionally, the user device may transmit an upstream service signal via a drop line. The user device may transmit a service signal via a specification such as MoCA, LoRa, or WiFi. Various protocols, specifications, and modulations (e.g., Frequency-Shift Keying (FSK)) may be used for transmitting to and from the first network device.

One or more user locations 200a, 200b may be or may be associated with a fixed location (e.g., premises) such as a home, office, or other structure, or region. The user location(s) 200a, 200b may comprise a tap. The tap may comprise one or more drop ports. Each of the drop ports may be associated with one or more drop lines to provide services to one or more premises. The tap may receive upstream signals such as service signals form one or more device located at the downstream premises. In a further aspect, the upstream service signal may be received (e.g., terminate) at one of the drop ports. The tap may be configured to receive a service signal via one or more of the drop ports and transmit a wireless signal based on the received service signal. The tap may be configured to monitor the one or more drop ports and to select the drop port supporting an active upstream signal for processing.

Alternatively, one or more user locations 200a, 200b may not be fixed. By way of example, a user may receive content from the distribution system 116 on a mobile device such as a laptop computer, PDA, smartphone, GPS, vehicle entertainment system, portable media player, and the like. There may be a multitude of user locations connected to distribution system 116.

Figure 2:
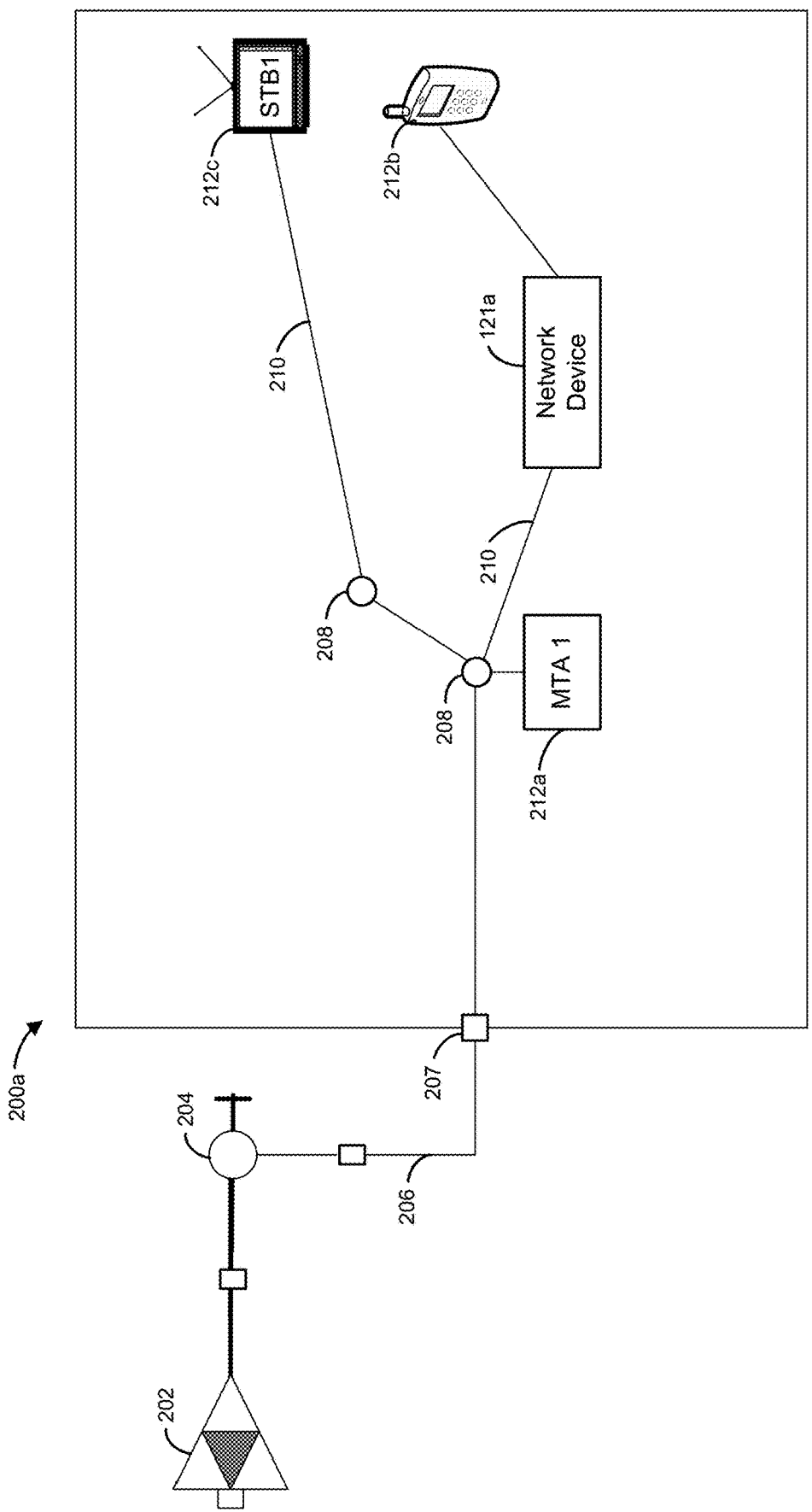
FIG. 2 is a schematic representation of an example network.

FIG. 2 illustrates an exemplary user location 200a having a network topology that may distribute signals throughout the user location 200a. As shown, in one embodiment, an amplifier 202 may be disposed in signal communication with the distribution system 116 to receive signals therefrom. In an aspect, the amplifier 202 may be a part of the distribution system 116. Any number of the amplifiers 202 and other signal processing devices may be interposed between the distribution system 116 and the user location 200a. As an example, the amplifier 202 provides a predetermined amplified input to a downstream component (e.g., output from the amplifier 202). As a further example, a value of the amplified input may be about 17 dBmV. In an aspect, a value of the amplified input may be between 16-18 dBmV. However, other values having other variances may be used.

A tap 204 may be in signal communication with the amplifier 202 to receive amplified signals, such as the amplified input, therefrom. As an example, the tap 204 may receive a signal directly from the distribution system 116. In an aspect, the tap 204 may provide an access point for "tapping" (e.g., accessing, capturing, analyzing, etc.) into the signals transmitted by the distribution system 116 for the particular user location 200a. It is further understood that any number of taps 204 may be used for particular applications, such as a multiple unit dwellings, business applications, office buildings, warehouses, etc.

An amount of signal energy presented at the tap(s) 204 to a user may depend upon at least two factors, namely, the available signal energy at the tap 204 and a padding level (e.g., attenuation value of any pad, attenuator, coupler, or the like) of the tap 204. As an example, the padding level of the tap 204 may be adjusted by adding or removing attenuation devices such as pads, attenuators, and the like. However, other factors may be considered such as loss of signal power (e.g., insertion loss or through-put loss) resulting from the insertion of a device (e.g. the tap 204) in a transmission line or network. By way of example, the tap(s) 204 may be padded at 14, 20, 23, 26 or 29 dB below the signal level input in order to provide the proper signal attenuation to users who may be close or distant from a tap off unit and/or the central location 101. However, other padding levels and configurations may be used.

A drop line 206 (e.g., cable or wireless link) may be coupled to the tap 204 and routed into a physical structure such as the user's home or business to provide a flow path for the signals received from the distribution system 116. As an example, the drop line 206 may have a length of 400 feet with an attenuation of −1.0 dBmV per 100 feet of length. Accordingly, the drop line 206 may have a drop loss of −4.0 dBmV.

A ground block 207 may be coupled to the drop line 206 downstream from the tap 204. Typically, the ground block 207 has a low through-put loss of signal (e.g., insertion loss) or signal attenuation and is not usually figured into an attenuation calculation. However, any insertion loss due to the ground block 207 may be included in the appropriate calculations described in further detail herein.

A splitter or plurality of splitters 208 may be disposed in or near a physical structure at the user location 200a to create a premises distribution topology to send/receive signals throughout various locations in the home or business. As an example, a first one of the splitters 208 may be coupled to the tap 204 by the drop line 206. As a further example, a first one of the splitters 208 may be coupled directly to the ground block 207. In an aspect, each of the splitters 208 may have an attenuation factor inherently associated therewith. For example, the following table provides exemplary attenuation values for particular types of the splitters 208:

| Splitter Type | Typical Attenuation |
| --- | --- |
| 2 way splitter | −3.5 dBmV |
| 3 way unbalanced splitter | −4, −4, −7 dBmV |
| 3 way balanced splitter | −5.5, −5.5, −5.5 dBmV |
| 4 way splitter | −7 dBmV |
| 8 way splitter | −11 dBmV |

It is understood that any splitter or similar device having any attenuation may be used without departing from the spirit of the present disclosure. One skilled in the art would understand that various configurations of the splitters 208 may be used to support the distribution requirements of any particular location or premises.

Additionally or alternatively, a fiber or optical network may be configured with an RF line in order to facilitate leak detection in a similar manner. As an example, fiber may not ingress/egress RF energy, but a coax wire or other RF-compatible wire may be disposed along the optical fiber to facilitate leakage detection. In this way, if the optical fiber is cut or frayed, the RF-compatible wire may be used to identify a location of the cut or fray due to ingress/egress at that cut location.

A plurality of premises lines 210, such as wireless links or cables, may be coupled to the first one of the splitters 208 to distribute the signals from the drop line 206 through the user location 200a. In an aspect, each of the premises lines 210 may have an attenuation factor inherently associated therewith. For example, the following table provides exemplary attenuation values for particular lengths of the premises lines 210 as well as other devices that may be coupled to the premises lines 210:

| Component | Typical Attenuation |
| --- | --- |
| 100′ RG6 coaxial | −1.25 dBmV |
| DOCSIS Equalizer (NMTER = 1): | −1 dBmV |
| In-Home Amplifier | −1 dBmV |

It is understood that any premises lines or cables having any attenuation may be used without departing from the spirit of the present disclosure. One skilled in the art would understand that various configurations of the premises lines 210 may be used to support the distribution requirements of any particular location or premises.

Other splitters 208 or devices 212 may be coupled to the premises lines 210 to receive the signals therefrom. Accordingly, the devices 212 in the user location 200a may be connected to the distribution system 116 through the tap 204. As an example, the connected devices 212 may include a multimedia terminal adapter (MTA) 212a, a network device 121a, a terminal such as a set-top box (STB) 212b, a mobile device such as a smart phone 212c, or other device in communication with the tap 204. As a further example, the devices 212 may include in-home devices, user devices, and systems configured to receive signals from at least one of the distribution system 116 and the central location 101. As an example, such signals may include LoRa compatible communications via one or more channels and/or subcarrier channels. As another example, such signals may include information beacons that may communicate time codes and position information to one or more devices 212. These beacons may be used to determine a location of other devices and/or sources of the beacon.

Figure 3:
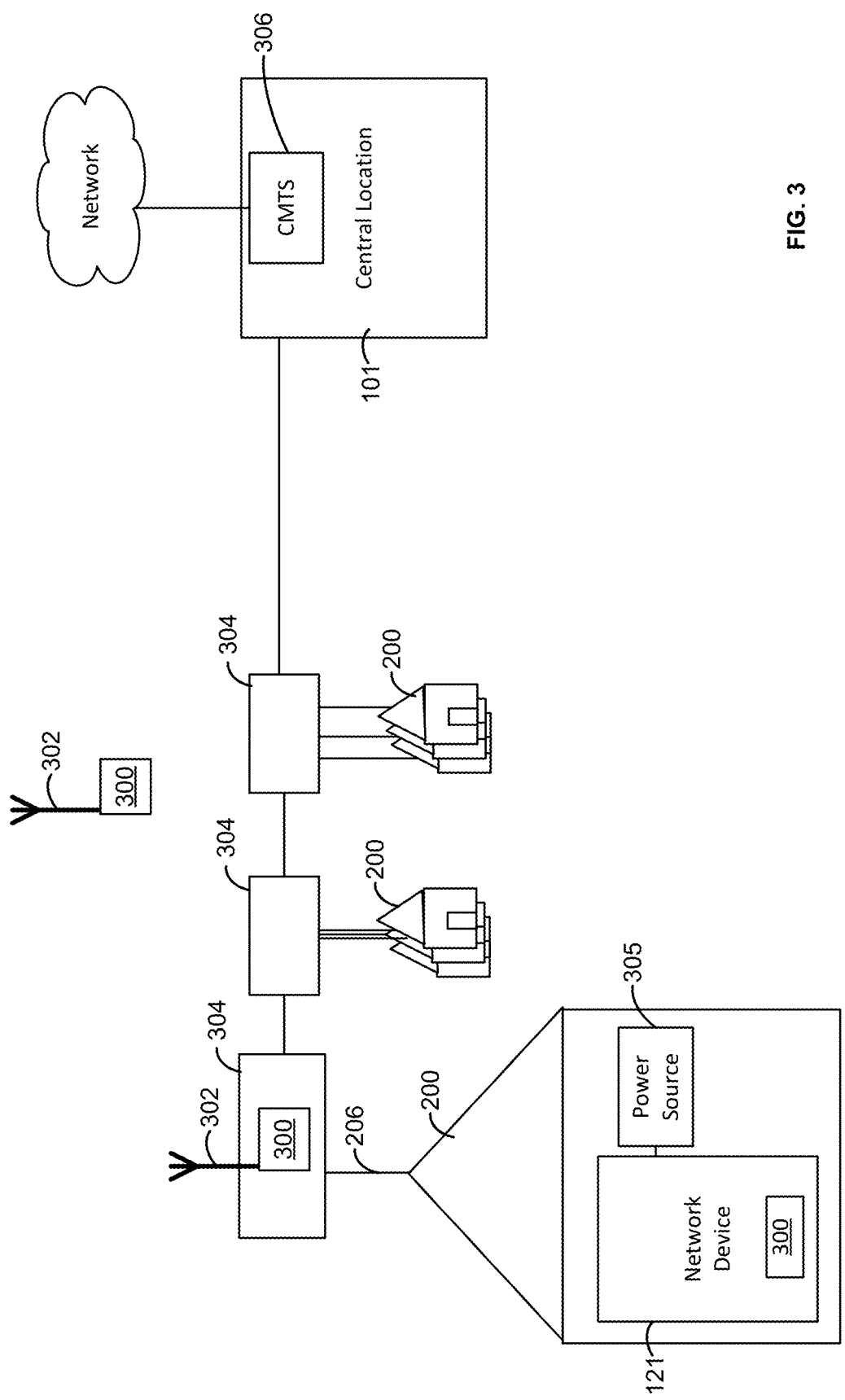
FIG. 3 is a schematic representation of an example network.

As shown in FIG. 3, a first network device (e.g., gateway, network device 121a) located at the premises 200a may receive a network service, for example, via a service signal transmitted to the premises. As an example, the service signal may be received by the first network device via drop line 206. As a further example, the drop line 206 may be configured to pass various signals such as network connectivity, analog or digital television, QAM signals, LoRa signals, DOCSIS signals, telephony, telemetry, etc.

Devices 300 may be configured to transmit and/or receive signals via one or more frequency bands and/or specifications (e.g., LoRa). As an example, the devices 300 may be configured to transmit and/or receive a wireless signal via respective antennas 302. The devices 300 may be embodied as discrete devices (e.g., gateways, taps, etc.) or may be disposed in or integrated with other devices such as the first network device. The devices 300 may receive electric power via power source 305 at a premises and/or via an infrastructure associated with a service provider. The devices 300 may be configured with a common clock such as a GPS clock and/or a DOCSIS clock, for example. As such, each of the devices 300 may provide a time measurement for transmission and/or reception of various signals. The devices 300 may be configured to communicate information to an upstream device or system such as central location 101. As illustrated one or more devices 300 and/or network devices 121 may be associated with the same CMTS 306. However, the devices 300 and or network devices 121 may be associated with different CMTS 306.

As an illustrative example, a device transmits a signal that ingresses into the network (e.g., cable plant). One or more devices 121, 300 may receive the signal. The network devices 121 may be associated with one or more CMTSs such as CMTS 306 and the like. When multiple network devices 121 receive the ingresses signal, one or more of the network devices 121 may be associated with the same or different CMTSs, and therefore different time sources.

Figure 4:
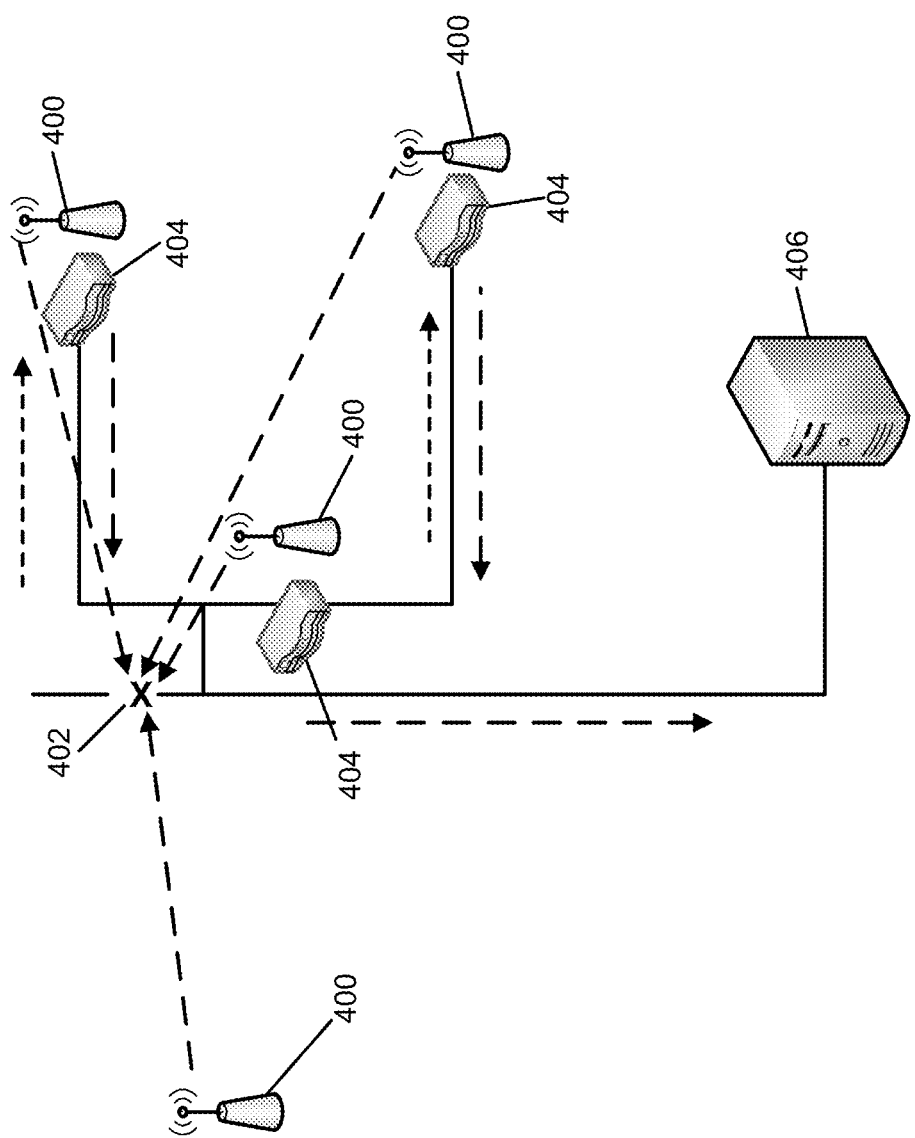
FIG. 4 is a schematic representation of an example network.

As shown in FIG. 4, systems and methods may use a plurality of devices 400 such as devices 300 (FIG. 3) configured to transmit and/or receive signals. As an example, such signals may be transmitted at a frequency band including 915 MHz. As another example such signals may be transmitted at or about 915 MHz.

One or more of the devices 400 may be fixed. The devices 400 may be embodied as a discrete module or device. The devices 400 may be disposed in or integrated with other devices such as a user device (e.g., gateway). The devices 400 may be associated with a location element (e.g., GPS) to provide a location. The devices 400 may be configured to determine a transmission/reception location (e.g., based on GPS), a time code indicating a transmission or reception time, and signal characteristics such as RSSI and/or dBm output/length of tx/channel. Such information may be used, for example by a computing device, to determine a location of a signal source.

As an example, one or more devices 400 may be configured to transmit a respective beacon (e.g., information signal). The beacons may comprise a location of a source of the beacon and/or a first time code indicating a time of transmission. The beacons may be transmitted over the air or directly via a hard wire (e.g., coax). As an example, one or more of the beacons may be transmitted via an OFDM subcarrier channel (or other subcarrier, subcarrier channel) in a transmission band including 900 MHz or 915 MHz. As another example, one or more of the beacons may be transmitted as a LoRa compatible communication or a frequency-shift keying (FSK), on/off keying (OOK), minimum-shift keying (MSK), Gaussian frequency shift keying (GFSK) communication, and/or the like.

In aspects where the beacons are transmitted over the air, the beacons may travel a free space distance before entering (e.g., ingress) an access point in a cable plant 402 (e.g., coaxial network). The access point may be a leakage point capable of ingress/egress of a signal. Upon entering the cable plant 402, the beacon may travel a network topology distance to one or more recipient devices 404. As illustrated in FIGS. 1-3, the network topology may comprise inherent attenuation and or free space loss over air that may affect a signal characteristic such as a signal strength parameter (e.g., RSSI). As such, when a recipient device 404 receives one or more of the beacons, the recipient device 404 may determine a receipt time and/or a signal strength parameter (e.g. RSSI). The information of the beacon and the information determined by the recipient device 404 may be provided to a computing device 406. The computing device 406 may be configured to determine a location of a source of the beacon and/or a location of the leakage point based on the information provided to the computing device 406, for example using trilateration, triangulation, multilateration, and the like.

In aspects where the beacons are transmitted via a hard wire, the beacons may travel a network topology distance and may exit (e.g., egress) at the leakage point in the cable plant 402. Upon exiting the cable plant 402, the beacon may travel a free space distance to one or more recipient devices 404. As illustrated in FIGS. 1-3, the network topology and freespace loss may comprise inherent attenuation that may affect a signal characteristic such as a signal strength parameter (e.g., RSSI). As such, when a recipient device 404 receives one or more of the beacons, the recipient device 404 may determine a receipt time and/or a signal strength parameter (e.g. RSSI). The information of the beacon and the information determined by the recipient device 404 may be provided to a computing device 406. The computing device 406 may be configured to determine a location of a source of the beacon and/or a location of the leakage point based on the information provided to the computing device 406, for example using trilateration, triangulation, multilateration, and the like.

As described herein, the beacons may be transmitted over various frequency bands and channels. As an example, certain OFDM subcarrier channels may be selected for transmission of one or more beacons. As another example, each beacon transmission may be designated at a different OFDM subcarrier channel. In aspects, where the beacon traffic may overlap with other traffic such as LoRa traffic, the beacons may be limited to transmission at certain times. As an example, during times where we are not beaconing 900 mhz LoRa traffic, we may monitor docsis 3.1 traffic in the same band for LDPC errors on each narrowband OFDM carrier.

As an illustrative example, if LoRa transmissions and DCOSIS 3.1 OFDM subcarriers are on the same frequency, interference may be experienced. As such, the DOCSIS subcarriers may be alternatively used with LoRa traffic. As an example, schedules and periodic timing may be used. Additionally, or alternatively, the DOCSIS subcarriers may be used at a low modulation level, so there are very few or no errors (at the cost of bandwidth on those subcarriers). Additionally, or alternatively, the DOCSIS subcarriers may be used at normal or near normal modulation levels and the LDPC forward error correction may be monitored. If errors are detected after LDPC attempts to correct, it may be determined that the modulation level is too high and may lead to packet loss. If a lower modulation level is implemented, DOCISS packets may pass through. By monitoring the activity of the forward error correction, it can be determined if there is interference on certain subcarriers (e.g., comparing errors prior to error correction versus errors after error correction).

Figure 5:
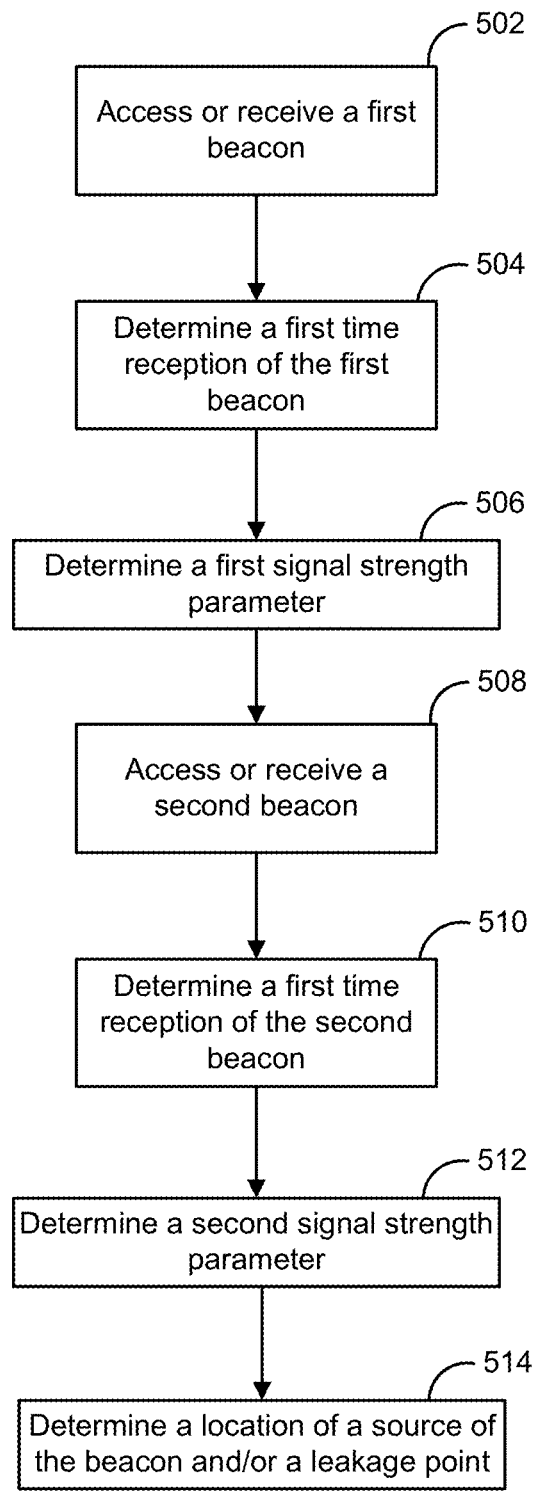
FIG. 5 is a flow chart of an example method.

FIG. 5 illustrates an example method that me be executed using various systems and networks including those illustrated in FIGS. 1-4. At step 502, a first beacon may be accessed or received. The first beacon may be accessed or received by a computing device (e.g., gateway) at a fixed location. The first beacon may be accessed or received via a first OFDM subcarrier channel in a transmission band including 900 MHz or 915 MHz. The first beacon may comprise a location of a source of the first beacon and a first time code indicating a time of transmission. As described herein, the first beacon may be received by ingress or egress at a leakage point in a coaxial network (e.g., cable plant).

At step 504, a first time of reception of the first beacon may be determined. As an example, the recipient device of the first beacon may determine a time measurement of the time of reception of the first beacon. The time measurement may a GPS time or a DOCSIS time. The time measurement may be common clock time.

At step 506, a first signal strength parameter associated with the first beacon may be determined. As an example, the first signal strength parameter may be determined by a recipient device of the first beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path. As such, the signal strength parameter and time delta between transmission time and reception time may be used to determine a distance the beacon has travelled.

At step 508, a second beacon may be accessed or received. The second beacon may be accessed or received by a computing device at a fixed location. The second beacon may be accessed or received via a second OFDM subcarrier channel in a transmission band including 900 MHz or 915 MHz. The second beacon may comprise a location of a source of the second beacon and a second time code indicating a time of transmission. As described herein, the second beacon may be received by ingress or egress at a leakage point in a coaxial network (e.g., cable plant).

At step 510, a second time of reception of the second beacon may be determined. As an example, the recipient device of the second beacon may determine a time measurement of the time of reception of the second beacon. The time measurement may a GPS time or a DOCSIS time. The time measurement may be common clock time.

At step 512, a second signal strength parameter associated with the second beacon may be determined. As an example, the second signal strength parameter may be determined by a recipient device of the second beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path. As such, the signal strength parameter and time delta between transmission time and reception time may be used to determine a distance the beacon has travelled.

At step 514, a location of a source of the beacon and/or a location of a leakage point in the cable plant may be determined. Such locations may be determined using trilateration, triangulation, multilateration, and the like. Such locations may be determined using at least the first time code, the location of the source of the first beacon, the first time of reception, the first signal strength parameter, the second time code, the location of the source of the second beacon, the second time of reception, and the second signal strength parameter. Additional information may be received and analyzed based on additional received beacons and respective time of reception and signal strength, for example in an iterative fashion as more beacons are collected and the location is enhanced.

Figure 6:
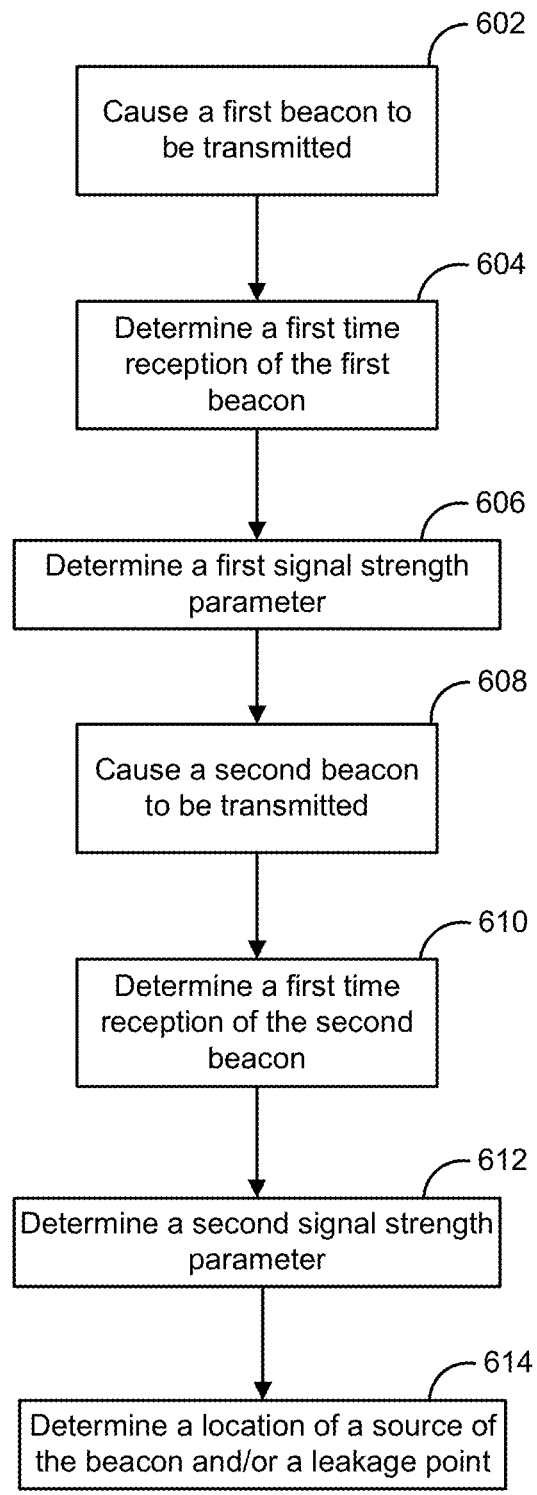
FIG. 6 is a flow chart of an example method.

FIG. 6 illustrates an example method that me be executed using various systems and networks including those illustrated in FIGS. 1-4. At step 602, a first beacon may be caused to be transmitted. The first beacon may be transmitted by a device such as the devices 300 (FIG. 3) or devices 400 (FIG. 4). The first beacon may be transmitted via a first OFDM subcarrier channel in a transmission band including 900 MHz or 915 MHZ. The first beacon may comprise a location of a source of the first beacon and a first time code indicating a time of transmission.

At step 604, a first time of reception of the first beacon may be determined. As described herein, the second beacon may be received by ingress or egress at a leakage point in a coaxial network (e.g., cable plant). As an example, the recipient device of the first beacon may determine a time measurement of the time of reception of the first beacon. The time measurement may a GPS time or a DOCSIS time. The time measurement may be common clock time.

At step 606, a first signal strength parameter associated with the first beacon may be determined. As an example, the first signal strength parameter may be determined by a recipient device of the first beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path. As such, the signal strength parameter and time delta between transmission time and reception time may be used to determine a distance the beacon has travelled.

At step 608, a second beacon may be caused to be transmitted. The second beacon may be transmitted by a device such as the devices 300 (FIG. 3) or devices 400 (FIG. 4. The second beacon may be transmitted via a second OFDM subcarrier channel in a transmission band including 900 MHz or 915 MHz. The second beacon may comprise a location of a source of the second beacon and a second time code indicating a time of transmission.

At step 610, a second time of reception of the second beacon may be determined. As described herein, the second beacon may be received by ingress or egress at a leakage point in a coaxial network (e.g., cable plant). As an example, the recipient device of the second beacon may determine a time measurement of the time of reception of the second beacon. The time measurement may a GPS time or a DOCSIS time. The time measurement may be common clock time.

At step 612, a second signal strength parameter associated with the second beacon may be determined. As an example, the second signal strength parameter may be determined by a recipient device of the second beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path. As such, the signal strength parameter and time delta between transmission time and reception time may be used to determine a distance the beacon has travelled.

At step 614, a location of a source of the beacon and/or a location of a leakage point in the cable plant may be determined. Such locations may be determined using trilateration, triangulation, multilateration, and the like. Such locations may be determined using at least the first time code, the location of the source of the first beacon, the first time of reception, the first signal strength parameter, the second time code, the location of the source of the second beacon, the second time of reception, and the second signal strength parameter.

Figure 7:
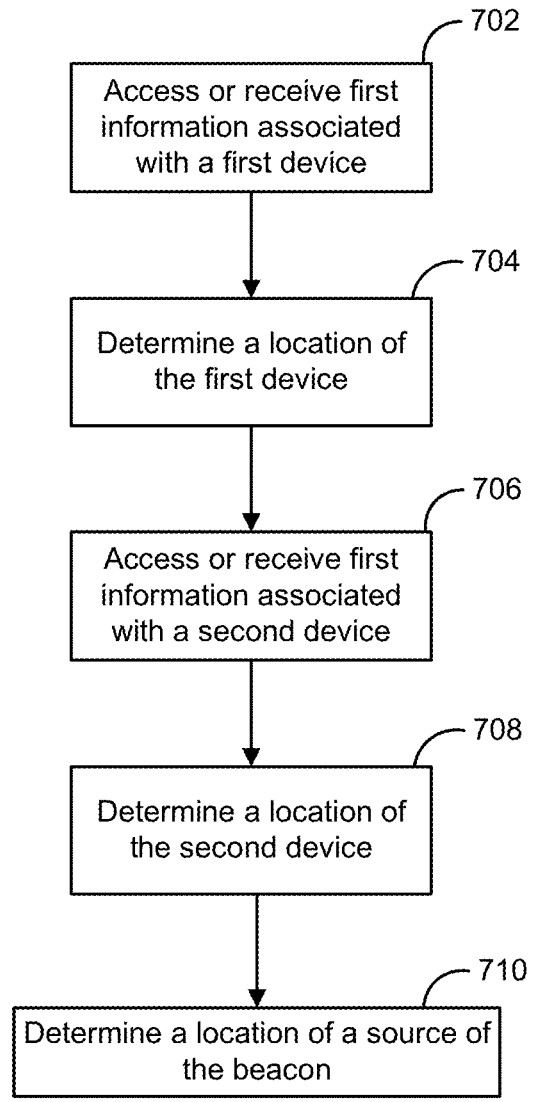
FIG. 7 is a flow chart of an exemplary method.

FIG. 7 illustrates an example method that me be executed using various systems and networks including those illustrated in FIGS. 1-4. The method may use a device configured to transmit a beacon (e.g., locator information). Network devices, such as gateways, may receive the beacon and may determine a time of arrival of the beacon. The time of arrival of the beacon at one or more network devices may be transmitted to a controller such as a radio controller. The controller may determine the location of the various network devices and may transmit the locations and the respective time of arrival to a geolocation resolver. The geolocation resolver may process the received information to determine a location of the devices. For example, the geolocation resolver may use a trilateration and/or a multilateration technique to determine the location of the devices.

At step 702, first information may be received or accessed. The first information may be associated with a first device (e.g., gateway) at a fixed location. The first information may comprise a first time code indicating a time of receipt of a beacon by the first device and a first signal strength parameter associated with the beacon. As an example, the first signal strength parameter may be determined by a recipient device of the beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path.

At step 704, the location of the first device may be determined. As an example, the location of the first device may be determined by GPS.

At step 704, second information may be received or accessed. The second information may be associated with a second device (e.g., gateway) at a fixed location. The second information may comprise a second time code indicating a time of receipt of a beacon by the second device and a second signal strength parameter associated with the beacon. As an example, the second signal strength parameter may be determined by a recipient device of the beacon. As described herein, the beacon may travel a free space distance and/or a network topology distance between transmission and reception. It is understood that attenuation of a signal over free space may be factored as a function of distance. Likewise, attenuation of a signal over a network topology may be dependent on distance and intervening infrastructure. Knowledge of the network topology in a given travel path may allow a more accurate determination of distanced travelled by a beacon over a given network path.

At step 708, the location of the second device may be determined.

At step 710, a location of a source of the beacon may be determined by multilateration using at least the first information, the second information, the location of the first device, and a location of the second device.

Figure 8:
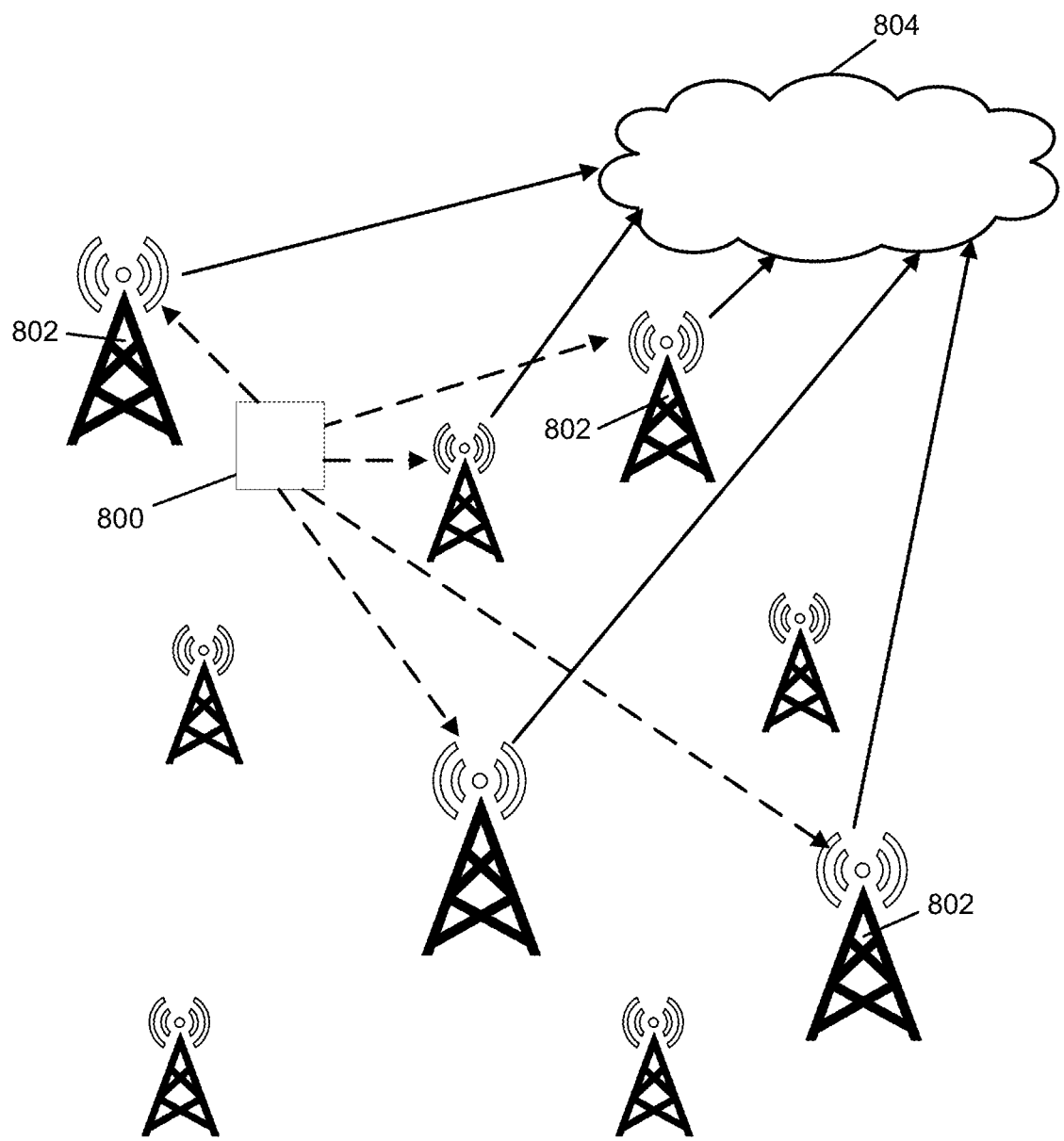
FIG. 8 is a block diagram of an example network.

FIG. 8 illustrates a use case of an example implementation of the method shown in FIG. 7. As shown, a device 800 is disposed on a package such as a deliverable unit. The device 800 may be configured to transmit a beacon (e.g., information signal). One or more gateways 802 may be configured to receive the beacon. As the package navigates from a source to a destination, the device 800 may transmit the beacon that may be received by one or more gateways 802 within a range of the beacon. The gateways 802 may determine a time of arrival of the beacon. In certain aspects, the gateways 802 may have a common clock that is synchronized between each other. Such clocks may include a GPS clock, a DOCSIS clock, an atomic clock, and the like. Although FIG. 8 illustrates over the air communication, it is understood that coax wire or RF-compatible wire may be used to define an RF network. This RF network may be used in a manner similar to that described in FIG. 4 to determine a location of the device 800. For example, the gateways 802 may be in communication with a computing device 804 via a wired network or a wireless network. In the instances of a wired network, the determination of location of the device 800 may be based in a similar manner as described in FIG. 4.

The time of arrival of the beacon at one or more gateways 802 may be transmitted to the computing device 804 such as a radio controller and/or geolocation resolver. The computing device 804 may determine the location of the various gateways. The computing device 804 may process the received/determined information to determine a location of the device 800. For example, the computing device 804 may use a trilateration and/or a multilateration technique to determine the location of the device 800.

As an example, the computing device 804 may use a time difference of arrival of the beacon from several gateways 802 to (a) generate a hyperbolic curve that contains the device 800 from each pair of gateways 802; (b) locate the intersection of the hyberbolic curves; (c) determine the location of the device 800 by using several hyperboloids or knowledge of the geometry of the DMA.

In certain aspects, determining a location of one or more recipient device such as the gateways 802 (FIG. 8) may comprise retrieving pre-determined location information. Additionally or alternatively, pre-positioned gateways may transmit a DOCSIS clock value and a GPS clock value to a geolocation resolver. The geolocation resolver may thus establish a correlation between the system's DOCSIS clock and the GPS clock. The geolocation resolver may seed the locations of the pre-positioned gateways. As an example, such pre-positioned gateways may be referred to as "strata one location" devices.

When a new gateway (or device) in placed in the network, the new gateway may proceed through DOCSIS power and ranging to determine a reference clock. If the new gateway has a GPS receiver, a GPS positioning algorithm may be used to determine a location and a GPS clock. The new gateway may transmit a beacon that contains a DOCSIS timestamp, the GPS position, and a GPS timestamp. As an illustrative example, when a new gateway is added in a home, it may determine its location. The gateway may "pretend" to be a sensor and may use geolocation (See FIGS. 5-7). Once a location is determined, the gateway may then use that location to assist locating other sensors.

The pre-positioned gateways may receive the beacon and may determine a time of reception, the received signal strength, and/or the bit error rate. Such information may be transmitted to a computing device such as a radio controller, a geolocation resolver, or both.

The computing device may use triangulation to find the position of the new gateway (using one or more timestamps provided by the new gateway). The computing device may use multilateration to find the position of the new gateway. The computing device may compare the results of the multilateration with the results of the triangulation and the results of a GPS geolocation.

If the compared locations disagree, the computing device may determine that a multipath exists between the new gateway device and one or more of the pre-positioned gateways. The computing device may eliminate pre-positioned gateways from a dataset, to remove gateway pair(s) that have multipath. For example, if the algorithm converges when one or more gateways are removed, the computing device may mark that the path between the new gateway and the pre-positioned gateway had multipath.

The computing device may determine the distance that was added to the path by the object causing the multipath. The distance may be used to approximate a position of the structure causing the multipath, which may be stored by the computing device. Over time, the geometry of the structure causing the multipath may be learned.

If the actual location of the new gateway is known (by using traditional survey methods, for instance), the clock error in the GPS signals may be calculated. Once the clock error is known, the distance and direction of the structure reflecting GPS signals can be approximated by drawing a triangle between the erroneous position, the correct position, and an elevated point halfway between them. If the orbital positions of the received satellites are known, the exact angle of the triangle can be determined. If the position of the satellites is not known, the angle of the triangle will not be precise, and thus the exact position of the obstruction will not be precise. The geolocation server can postulate that there is a building at this location, and may further postulate that it is a regularly shaped structure. If sufficient measurements are taken, the geometry of the building can be approximated. The geolocation resolver may postulate that this structure is also reflecting the terrestrial signals, and use this measurement in the algorithms described herein.

Additionally or alternatively, different accuracies of clock sources may exist in a system or network. As an example, Strata 1 are direct clock sources. But, when a gateway is installed and pulls its clock source from other gateways to determine its location, that may be referred to as a strata 2 clock source. When using the various clock sources to determine a location, a much higher weight is added to higher strata sources. As an illustrative example, a device may be determined to be within a 10 m circle using strata 1 sources, but a strata 2 source pinpoints the device outside of that circle or tries to expand it, the system and/or method may ignore or discard the strata 2 data. However if multiple strata 2 sources agree between each other, and with the strata 1 sources, we can use those to get a more precise location.

Once the system is trained to know that there are reflective obstructions in certain paths, it may be determined that a proposed device location is in an affected region and a recalculation of an actual position may be executed. If a device's position resolves to an impossible location, or a location is converged upon by removing sample with suspected multipath, the multipath may be learned. For example, a measurement that has a suspected multipath may be mapped to the known reflective objects that lie between the device and the gateway experiencing the multipath. Over time, the system may be able to differentiate between a "regular reflector" like a glass building in a single plane and an "irregular reflector" like a multifaceted structure.

When geolocating (via triangulation, trilateration, or multilateration), it is important for a receiver to be able to precisely determine when a given beacon arrived. The following procedure provide for a stronger signal (e.g., max power) with a simpler modulation technique (e.g., FSK) that carries a well-known pattern, on demand. This allows the receiver(s) to more accurately determine the transmission time of the beacon, and thus the time arrival, and thus the position of the new device.

As an example, the new device (device or new gateway) may transmit a LoRa signal, which includes a timestamp. The signal is received by one or more gateways. The gateways send the packet and the metadata to the radio controller. The radio controller sends the metadata to the geolocation resolver. The geolocation resolver determines if a more precise location is needed. If it is needed, it sends a message to the radio controller.

The gateway may wait for the downstream transmit opportunity, and send a message to the device. This message instructs the device to send the new beacon at a precise time. The device sends a special beacon at the indicated time. This special beacon uses a simpler modulation technique (for instance FSK) at max power, and carries a well-known payload (for instance a payload that causes a "cliff" in the transmitted signal) that allows the receiver to search for a specific position in the upstream beacon. The device also time stamps the FSK beacon with the local time that it was sent. Having the exact time stamp in the two beacons allows the system to determine if the device is in motion. If the device has moved between the two beacons, the system will see a Doppler shift in the beacon timing.

Within a given CMTS domain the receivers may share a common clock (e.g., based on a common TDMA scheme on the CMTS). However, when correlating clocks between gateways that are on different CMTSs, other timing elements may used. For example, a shared GPS clock on the gateways may be used (with or without a second clock) to geolocate a fixed gateway, and then use the clock from the know gateway to do clock correlation between the CMTS domains.

Additionally or alternatively, a gateway in a first clock domain may transmit a beacon (with a timestamp). Gateways in a second clock domain may geolocate the first gateway, using multilateration. The first gateway may be geolocated using trilateration. The trilateration-derived position may be compared with the multilateration position, and a clock offset may be between the two clock domains to find a best fit.

In certain aspects, a plurality of devices may be deployed on fixed assets whose positions are known (the top of fire hydrants, for instance). When a given fire hydrant sends a beacon, it would be received by several gateways. The gateways would send the beacon metadata (sent power level, antenna type, RSSI of the LoRa signal, RSSI of the FSK pulse, time of arrival of LoRa, time of arrival of FSK, time of arrival and amplitude of any received secondary multipath copies of the beacon, etc) to the cloud. The cloud may save several copies of this metadata for each fixed device. When a new device needs to be geolocated, the location resolver (in addition to multilateration) could simply compare the metadata associated with this beacon to the metadata associated with the known devices and provide an estimate of the device's location. This could be as simple as finding the fixed device that most closely matches the metadata of this device, or it could interpolate between several sets of metadata.

Figure 9:
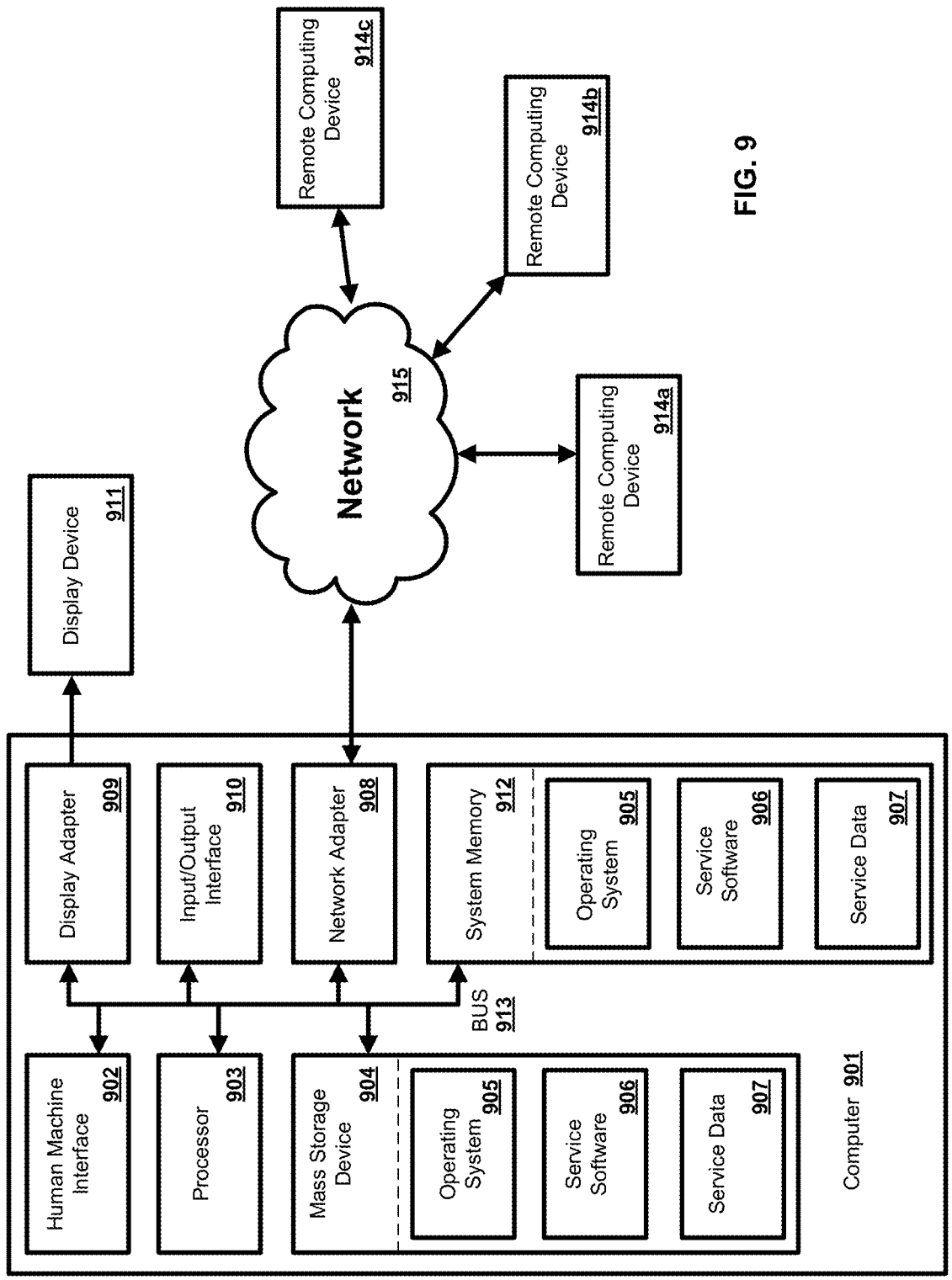
FIG. 9 is a block diagram of an example computing device.

In an exemplary aspect, the methods and systems may be implemented on a computing device such as a computing device 901 (e.g., computer) as illustrated in FIG. 9 and described below. By way of example, CT 120a, 120b, and/or network devices 121a, 121b of FIG. 1 may be a computing device as illustrated in FIG. 9. Similarly, the methods and systems disclosed may utilize one or more computing device to perform one or more functions in one or more locations. FIG. 9 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems may be operational with numerous other general purpose or special purpose computing system environments or configurations. Examples of well known computing systems, environments, and/or configurations that may be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems may be performed by software components. The disclosed systems and methods may be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods may also be practiced in grid-based and distributed computing environments where tasks are performed by remote processing devices that are linked through a communications network. In a distributed computing environment, program modules may be located in both local and remote computer storage media including memory storage devices.

Further, one skilled in the art will appreciate that the systems and methods disclosed herein may be implemented via a general-purpose computing device in the form of a computing device 901. The components of the computing device 901 may comprise, but are not limited to, one or more processors or processing units 903, a system memory 912, and a system bus 913 that couples various system components including the processor 903 to the system memory 912. In the case of multiple processing units 903, the system may utilize parallel computing.

The system bus 913 represents one or more of several possible types of bus structures, including a memory bus or memory controller, a peripheral bus, an accelerated graphics port, and a processor or local bus using any of a variety of bus architectures. By way of example, such architectures may comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 913, and all buses specified in this description may also be implemented over a wired or wireless network connection and each of the subsystems, including the processor 903, a mass storage device 904, an operating system 905, a service software 906, a service data 907, a network adapter 908, system memory 912, an Input/Output Interface 910, a display adapter 909, a display device 911, and a human machine interface 902, may be contained within one or more remote computing devices 914a,b,c at physically separate locations, connected through buses of this form, in effect implementing a fully distributed system.

The computing device 901 typically comprises a variety of computer readable media. Exemplary readable media may be any available media that is accessible by the computing device 901 and comprises, for example and not meant to be limiting, both volatile and non-volatile media, removable and non-removable media. The system memory 912 comprises computer readable media in the form of volatile memory, such as random access memory (RAM), and/or non-volatile memory, such as read only memory (ROM). The system memory 912 typically contains data such as service data 907 and/or program modules such as operating system 905 and service software 906 that are immediately accessible to and/or are presently operated on by the processing unit 903.

In another aspect, the computing device 901 may also comprise other removable/non-removable, volatile/non-volatile computer storage media. By way of example, FIG. 9 illustrates a mass storage device 904 which may provide non-volatile storage of computer code, computer readable instructions, data structures, program modules, and other data for the computing device 901. For example and not meant to be limiting, a mass storage device 904 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules may be stored on the mass storage device 904, including by way of example, an operating system 905 and service software 906. Each of the operating system 905 and service software 906 (or some combination thereof) may comprise elements of the programming and the service software 906. Service data 907 may also be stored on the mass storage device 904. Service data 907 may be stored in any of one or more databases known in the art. Examples of such databases comprise, DB2®, Microsoft® Access, Microsoft® SQL Server, Oracle®, mySQL, PostgreSQL, and the like. The databases may be centralized or distributed across multiple systems.

In another aspect, the user may enter commands and information into the computing device 901 via an input device (not shown). Examples of such input devices comprise, but are not limited to, a keyboard, pointing device (e.g., a "mouse"), a microphone, a joystick, a smayner, tactile input devices such as gloves, and other body coverings, and the like These and other input devices may be connected to the processing unit 903 via a human machine interface 902 that is coupled to the system bus 913, but may be connected by other interface and bus structures, such as a parallel port, game port, an IEEE 1394 Port (also known as a Firewire port), a serial port, or a universal serial bus (USB).

In yet another aspect, a display device 911 may also be connected to the system bus 913 via an interface, such as a display adapter 909. It is contemplated that the computing device 901 may have more than one display adapter 909 and the computing device 901 may have more than one display device 911. For example, a display device may be a monitor, an LCD (Liquid Crystal Display), or a projector. In addition to the display device 911, other output peripheral devices may comprise components such as speakers (not shown) and a printer (not shown) which may be connected to the computing device 901 via Input/Output Interface 910. Any step and/or result of the methods may be output in any form to an output device. Such output may be any form of visual representation, including, but not limited to, textual, graphical, animation, audio, tactile, and the like. The display 911 and computing device 901 may be part of one device, or separate devices.

The computing device 901 may operate in a networked environment using logical connections to one or more remote computing devices 914*a,b,c*. By way of example, a remote computing device may be a personal computer, portable computer, smartphone, a server, a router, a network computer, a peer device or other common network node, and so on. Logical connections between the computing device 901 and a remote computing device 914*a,b,c* may be made via a network 915, such as a local area network (LAN) and a general wide area network (WAN). Such network connections may be through a network adapter 908. A network adapter 908 may be implemented in both wired and wireless environments. Such networking environments are conventional and commonplace in dwellings, offices, enterprise-wide computer networks, intranets, and the Internet.

For purposes of illustration, application programs and other executable program components such as the operating system 905 are illustrated herein as discrete blocks, although it is recognized that such programs and components reside at various times in different storage components of the computing device 901, and are executed by the data processor(s) of the computer. An implementation of service software 906 may be stored on or transmitted across some form of computer readable media. Any of the disclosed methods may be performed by computer readable instructions embodied on computer readable media. Computer readable media may be any available media that may be accessed by a computer. By way of example and not meant to be limiting, computer readable media may comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by a computer.

The methods and systems may employ artificial intelligence (AI) techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that may be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that may be performed it is understood that each of these additional steps may be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, may be implemented by special purpose hardware-based computer systems that perform the specified functions or steps, or combinations of special purpose hardware and computer instructions.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations may be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method comprising:
receiving first information associated with a first device at a fixed location, the first information comprising a first time code indicating a time of receipt of a beacon by the first device and a first signal strength parameter associated with the beacon;
determining the location of the first device;
receiving second information associated with a second device at a fixed location, the second information comprising a second time code indicating a time of receipt of the beacon by the second device and a second signal strength parameter associated with the beacon, wherein a clock of the first device is synchronized with a clock of the second device;
determining the location of the second device;
determining a first location of a source of the beacon by multilateration using at least the first information, the second information, the location of the first device, and the location of the second device;
determining a second location of the source of the beacon by triangulation using one or more of the first information, the second information, the location of the first device, and the location of the second device; and
comparing the first location to the second location to determine an enhanced location of the source of the beacon.

2. The method of claim 1, wherein the beacon comprises a low power wide area network communication, frequency-shift keying (FSK) communication, on/off keying (OOK) communication, minimum-shift keying (MSK) communication, or Gaussian frequency shift keying (GFSK) communication.

3. The method of claim 1, wherein at least one of the first signal strength parameter or the second signal strength parameter comprises a received signal strength indicator (RSSI).

4. The method of claim 1, wherein one or more of the first time code and the second time code is based on a DOCSIS time.

5. The method of claim 1, wherein the source of the beacon comprises a network device.

6. The method of claim 1, wherein the source of the beacon comprises a transmitter disposed on a moveable object to be tracked.

7. A computing device comprising:
one or more processors; and
memory storing instructions that, when executed by the one or more processors, cause the computing device to:
receive first information associated with a first device at a fixed location, the first information comprising a first time code indicating a time of receipt of a beacon by the first device and a first signal strength parameter associated with the beacon;
determine the location of the first device;
receive second information associated with a second device at a fixed location, the second information comprising a second time code indicating a time of receipt of the beacon by the second device and a second signal strength parameter associated with the beacon, wherein a clock of the first device is synchronized with a clock of the second device;
determine the location of the second device;
determine a first location of the source of the beacon by multilateration using at least the first information, the second information, the location of the first device, and the location of the second device;
determine a second location of a source of the beacon by triangulation using one or more of the first information, the second information, the location of the first device, and the location of the second device; and
compare the first location to the second location to determine an enhanced location of the source of the beacon.

8. The computing device of claim 7, wherein the beacon comprises a low power wide area network communication, frequency-shift keying (FSK) communication, on/off keying (OOK) communication, minimum-shift keying (MSK) communication, or Gaussian frequency shift keying (GFSK) communication.

9. The computing device of claim 7, wherein at least one of the first signal strength parameter or the second signal strength parameter comprises an RSSI.

10. The computing device of claim 7, wherein one or more of the first time code and the second time code is based on a DOCSIS time.

11. The computing device of claim 7, wherein the source of the beacon comprises a network device.

12. The computing device of claim 7, wherein the source of the beacon comprises a transmitter disposed on a moveable object to be tracked.

13. A non-transitory computer-readable storage medium storing instructions that, when executed, cause:
receiving first information associated with a first device at a fixed location, the first information comprising a first time code indicating a time of receipt of a beacon by the first device and a first signal strength parameter associated with the beacon;
determining the location of the first device;
receiving second information associated with a second device at a fixed location, the second information comprising a second time code indicating a time of receipt of the beacon by the second device and a second signal strength parameter associated with the beacon, wherein a clock of the first device is synchronized with a clock of the second device;
determining the location of the second device;
determining a first location of a source of the beacon by multilateration using at least the first information, the second information, the location of the first device, and the location of the second device;
determining a second location of the source of the beacon by triangulation using one or more of the first information, the second information, the location of the first device, and the location of the second device; and
comparing the first location to the second location to determine an enhanced location of the source of the beacon.

14. The non-transitory computer-readable storage medium of claim 13, wherein the beacon comprises a low power wide area network communication, frequency-shift keying (FSK) communication, on/off keying (OOK) communication, minimum-shift keying (MSK) communication, or Gaussian frequency shift keying (GFSK) communication.

15. The non-transitory computer-readable storage medium of claim 13, wherein at least one of the first signal strength parameter or the second signal strength parameter comprises an RSSI.

16. The non-transitory computer-readable storage medium of claim 13, wherein one or more of the first time code and the second time code is based on a DOCSIS time.

17. The non-transitory computer-readable storage medium of claim 13, wherein the source of the beacon comprises a network device.

18. The non-transitory computer-readable storage medium of claim 13, wherein the source of the beacon comprises a transmitter disposed on a moveable object to be tracked.

* * * * *